(12) United States Patent
Mathai et al.

(10) Patent No.: US 8,461,565 B2
(45) Date of Patent: Jun. 11, 2013

(54) ELECTRICALLY ACTUATED DEVICES

(75) Inventors: Sagi Varghese Mathai, Palo Alto, CA (US); Michael Renne Ty Tan, Menlo Park, CA (US); Wei Wu, Palo Alto, CA (US); Shih-Yuan (SY) Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 92 days.

(21) Appl. No.: 13/130,811

(22) PCT Filed: Jan. 29, 2009

(86) PCT No.: PCT/US2009/032484
§ 371 (c)(1),
(2), (4) Date: May 24, 2011

(87) PCT Pub. No.: WO2010/087835
PCT Pub. Date: Aug. 5, 2010

(65) Prior Publication Data
US 2011/0221038 A1    Sep. 15, 2011

(51) Int. Cl.
*H01L 47/00* (2006.01)
(52) U.S. Cl.
USPC ............. 257/4; 257/1; 257/E21.006; 438/385
(58) Field of Classification Search
USPC .................... 257/608, 659, 29, E29.005, 4, 1, 257/E21.006; 438/104, 385
See application file for complete search history.

(56) References Cited

U.S. PATENT DOCUMENTS

| | | |
|---|---|---|
| 2008/0232154 A1 | 9/2008 | Kinoshita |
| 2008/0239797 A1 | 10/2008 | Tsukamoto et al. |
| 2008/0265235 A1 | 10/2008 | Kamigaichi et al. |

OTHER PUBLICATIONS

Y. Liu, et al., "Charging effect of Al2O3 thin films containing Al nanocrystals", Applied Physics Letters 93, 142106 (2008).

*Primary Examiner* — Julio J Maldonado
*Assistant Examiner* — Amar Movva

(57) ABSTRACT

An electrically actuated device comprises an active region disposed between a first electrode and a second electrode, a fixed dopant distributed within the active region, and at least one type of mobile dopant situated near an interface between the active region and the second electrode.

15 Claims, 3 Drawing Sheets

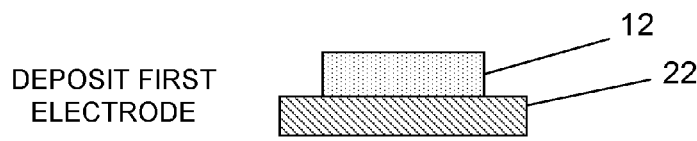
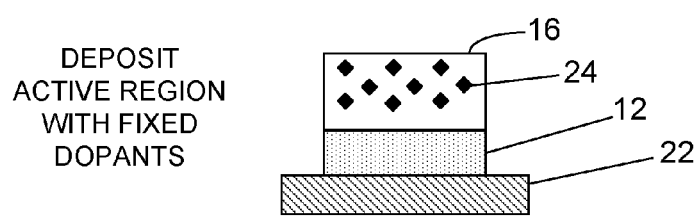
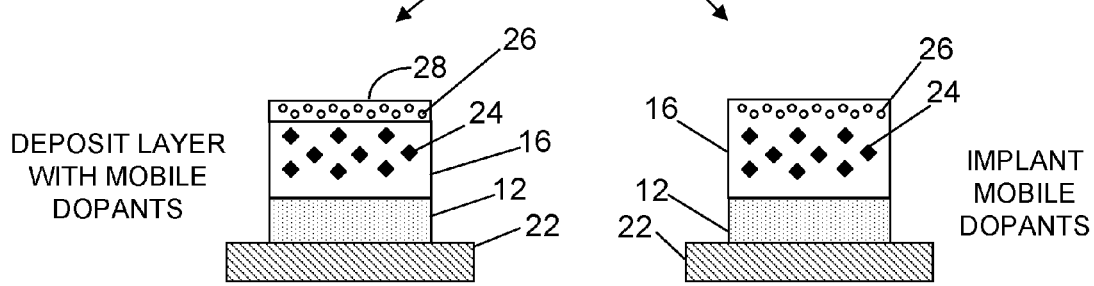
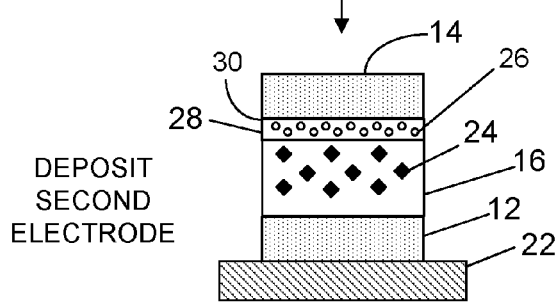
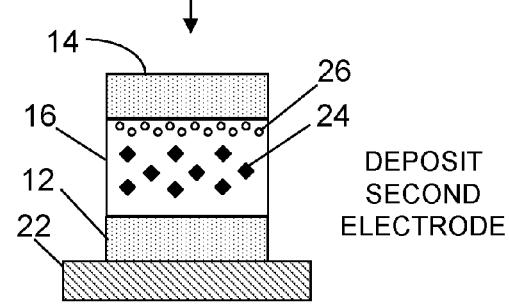
FIG. 3A
FIG. 3B
FIG. 3C
FIG. 3E
FIG. 3D
FIG. 3F

ELECTRICALLY ACTUATED DEVICES

BACKGROUND

Nanometer-scale crossed-wire switching devices have been reported that can be switched reversibly and exhibit an ON-to-OFF conductance ratio of about $10^3$. Such devices have been used to construct crossbar circuits and provide a promising route for the creation of ultra-high density non-volatile memory and non-volatile device based electronics. A series connection of crossed-wire switches has been used to construct a latch, which is an important component of logic circuits and for communication between logic and memory. New logic families constructed from crossbar arrays of switches have the potential to dramatically increase the computing efficiency of CMOS circuits. The breadth of applications of such devices can be further enhanced by approaches that adjust their performance characteristics.

BRIEF DESCRIPTION OF THE DRAWINGS

FIGS. 3A through 3F are schematic views depicting two processes in accordance with another embodiment of the method for doping an electrically actuated switch.

DETAILED DESCRIPTION OF EXAMPLE EMBODIMENTS

Figure 1A:
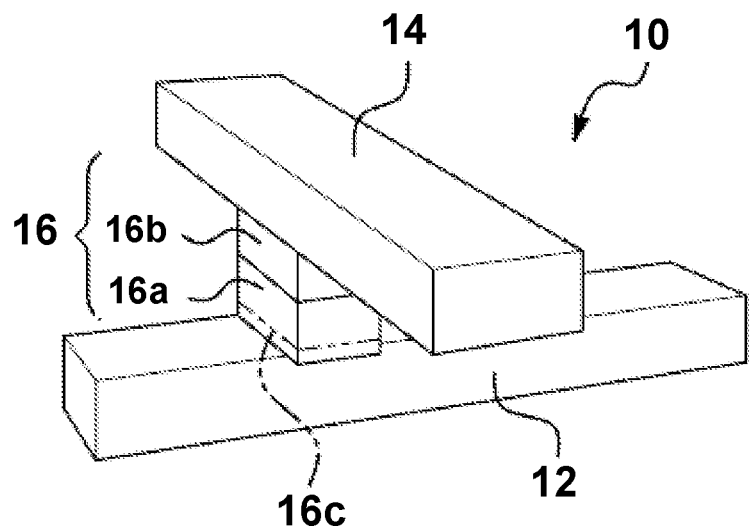
FIG. 1A is a perspective view of an embodiment of a solid state electrically actuated switch connecting two different crossed wires.

Reference will now be made to the exemplary embodiments illustrated, and specific language will be used herein to describe the same. Features and advantages of the invention will be apparent from the detailed description which follows, taken in conjunction with the accompanying drawings, which together illustrate, by way of example, features of the invention. For the sake of brevity, reference numerals having a previously described function may or may not be described in connection with subsequent drawings in which they appear.

The present disclosure is generally directed to electrically actuated devices, and particularly to electrically actuated switches having multiple state variables. In a broader sense, an electrically actuated switch may include an active region situated between two wires. The active region can comprise a material that is a weak ionic conductor as well as being either an electronic semiconductor or nominally insulating. More particularly, it can be a material that is capable of transporting and hosting ions that act as dopants to control the flow of electrons through the switch. At least one portion of the active region serves as a dopant source or sink and includes one or more species of dopants that are capable of drifting into intrinsic regions of the material under a suprathreshold bias voltage. Such dopants can include mobile charged dopants such as vacancies, interstitials, and other charged impurities. In embodiments of the present invention, less mobile or fixed dopants may also be included in the active region.

The potential difference between the electrode and the active region forms a tunneling barrier at this interface. When the active region material is essentially intrinsic, the tunneling barrier is high and wide, and thus the conductivity through the switch is low (i.e. the switch is in the "OFF" state). Applying a sufficiently high forward bias voltage (e.g. 0.1 V to 10 V) to the electrodes causes both ion current and electron current to flow in the switch. Dopant ions move into the intrinsic active material, resulting in a significant decrease in resistance of the switch (i.e. the switch is in an "ON" state). The active region material and dopants are chosen such that the flow into or out of the active material is possible, but not too facile. This is to ensure that the switch is nonvolatile, i.e. it will remain in whatever state it is set for a reasonably long time. At a low bias the flow of ion current is negligible, which allows the switch to hold its resistance. The switch is also reversible, in that a sufficient reverse bias voltage (e.g. −0.1 to −10 V) drives the dopants back out of the switching region and resistance increases as the active material approaches its previous intrinsic state.

Figure 1B:
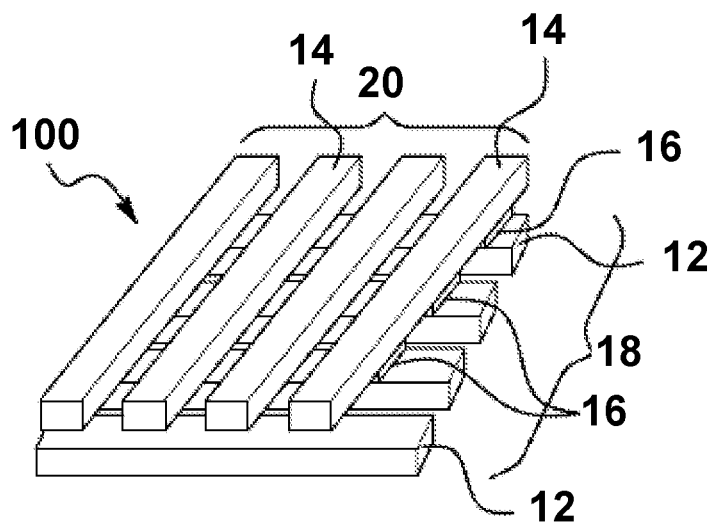
FIG. 1B is a perspective view of an array of the switches of FIG. 1.

FIGS. 1A and 1B illustrate an example of a solid-state electrically actuated switch 10 and cross-bar array 100. In FIG. 1A, two different crossed wires or electrodes 12, 14 have a switch junction 16 therebetween. The switch junction includes a primary active region 16a and a secondary active region 16b. The secondary active region is a material that acts as a source and sink of the dopants. As shown in FIG. 1A, the switch junction may also include a molecular layer 16c as a non-covalently bonded interface, where the molecular layer includes molecules that may or may not be switchable by the bias voltage.

One or both wires may be metal or semiconductor materials. In some instances, both wires or electrodes are metal. The switch may be built at the microscale or the nanoscale. The switch may be used to connect two different wires, such as a pair of crossing wires as shown in FIGS. 1A-1B, which may be two wires in a larger crossbar array. Alternatively, the switch may be used within a wire in order to affect current flow along the wire.

A crossbar array 100 may also be formed including a plurality of the solid-state electrically actuated switches 10 shown in FIG. 1A. As shown in FIG. 1B, a first layer 18 of approximately parallel wires 12 is overlaid with a second layer 20 of approximately parallel wires 14. The second layer is roughly perpendicular in orientation to the wires of the first layer. However, the orientation angle between the layers may vary.

Although individual wires in the figures are shown with square or rectangular cross-sections, wires may also have circular, elliptical, or more complex cross-sections. The wires may also have many different widths or diameters and aspect ratios or eccentricities. The term "nanowire crossbar" may refer to crossbars having one or more layers of sub-microscale wires, microscale wires or wires with larger dimensions in addition to nanowires.

The present disclosure particularly describes an electrically actuated device in which mobile and fixed dopants are used together to provide for multiple state variables in the operation of the device. Also disclosed are methods for fabricating such a device. In a general embodiment, an electrically actuated device can comprise two metal electrodes and an active region disposed therebetween, wherein the electrodes and active region comprise materials having the general properties described above as being suitable for such devices.

More particularly, the active region material is capable of both hosting and transporting mobile dopant species. In the OFF state, the mobile dopants are substantially localized near an interface between the active region and one of the electrodes. This may be a thin film of a material that is a source of dopants for the active region material. These dopants may be impurity atoms such as hydrogen or some other material that acts as an electron donor for the active region material, such as alkali or transition metals. Suitable dopants may also be anion vacancies that are charged in the active region material. It is also possible to drive anions into the active region material. The active region may also be a thin film, so that only a short time is needed for enough dopants to drift into or out of a region of the film to substantially change its conductivity.

In the general embodiment of the invention, the active region material can also include less mobile dopants or uncharged dopants incorporated into its structure and distributed within the active region material. In a more particular aspect, the dopants may be substantially fixed in the structure of the active region material. In a particular embodiment, the fixed dopants and mobile dopants are chosen so that at least one of the mobile dopant types can associate or otherwise interact with fixed dopants in the active region. For example, a mobile dopant moving through the active region under a suprathreshold bias voltage may interact with fixed dopants it encounters in the material. Alternatively, a mobile dopant may be already associated with a fixed dopant under subthreshold voltage and then disspciate from the fixed dopant under suprathreshold bias voltage. This dissociation may liberate and activate the mobile dopant so that it may participate in electronic flow. Still alternatively, the dissociation may activate fixed dopants that were passivated by the mobile dopant. Accordingly, in a more particular embodiment at least one of the mobile dopant types is capable of reversibly passivating a fixed dopant. In another particular embodiment, at least one of the mobile dopant types is capable of reversibly passivating another type of mobile dopant.

Electrically actuated switches as described herein exhibit an electrically controllable conductance that can be varied over a wide range of values. The range of conductance in the actuated state is largely continuous, e.g. the resistance of the switch changes from the OFF state to a range of ON states in, which the magnitude of conductance is determined in part by the overall conductivity of the switch material. More specifically, dopant movement into the active region decreases the tunneling barrier through the region, changing its conductivity, and the degree of doping depends on the time and magnitude of voltage applied during actuation as well as the mobility of the dopant species. As such, each mobile dopant provides a variable in the state of the device after actuation.

The inclusion of fixed and mobile dopants together can confer an additional level of control over the device's properties by providing multiple state variables in the conductance function. In such a device, a given mobile dopant may serve as a switching center in an injected region of the active material, or it may interact with a fixed dopant and alter the effect of the fixed dopant on the tunneling barrier. Therefore in that region there may be at least three variables determining conductance: unassociated fixed dopants, unassociated mobile dopants, and fixed dopants associated with mobile dopants. This aspect can be elaborated further by the use of more than one species of mobile dopant, where the group of species may include one or more of: higher mobility dopants, lower mobility dopants, dopants that interact with (e.g. passivate) fixed dopants in the active region material, and dopants that do not interact with the fixed dopants in the active region material.

The additional state variables may result in a device having different characteristics than devices employing only a mobile dopant. For example, the range of conductances in such a device, may be more continuous, and therefore result in a finer level of control. In addition, such devices may exhibit more complex electrical characteristics. For example, the current-voltage function of a multi-state variable device may have multiple regimes, each exhibiting a different current-to-voltage relationship. Dopant combinations may be chosen so as to enhance any of these aspects of the device.

Figure 2A:
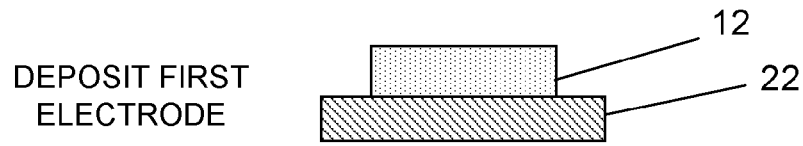
FIGS. 2A through 2D are schematic views depicting an embodiment of the method for fabricating an electrically actuated switch.

The present disclosure also sets forth methods for fabricating electrically actuated devices having multiple state variables such as the devices discussed above. As shown in FIG. 2A, such a method can comprise depositing onto a substrate 22 a metal or other appropriate material so as to form a first electrode 12. The electrode may be deposited by conventional techniques including photolithography or electron beam lithography, or by more advanced techniques such as imprint lithography. The electrodes that are included in this device may be any suitable conductive material, such as gold, platinum, tungsten, or copper. In other embodiments, any of the electrodes may include a semiconductor.

Figure 2B:
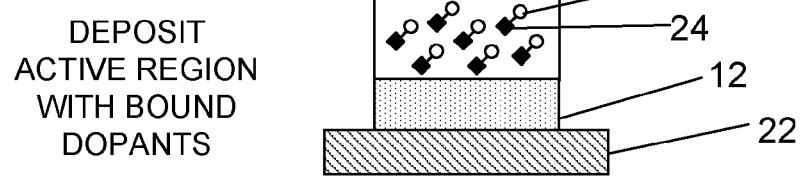

An active region 16 may then be deposited onto the first electrode as shown in FIG. 2B. Suitable deposition techniques include conventional physical and chemical techniques, including evaporation from a Knudsen cell, electron beam from a crucible, sputtering from a target, electron beam evaporation, chemical vapor deposition (CVD), metal-organic chemical vapor deposition (MOCVD), molecular beam epitaxy, atomic layer deposition, or other forms of chemical vapor or beam growth from reactive precursors. The active region material may be deposited as a thin film from 1 to 100 nanometers thick. In a particular embodiment, the film is deposited or grown to have a crystalline structure.

In accordance with an embodiment, the active region may be grown to include dopants. In a particular embodiment, the active region is grown to include dopants that win act as fixed dopants 24 in the device. The fixed dopants may be incorporated into the active region by techniques known in the art for doping the material used. For example, doped semiconductors can be made by an appropriate combination of suitable materials such that the resulting material includes impurities or defects that can act as charge carriers. In some instances, the active region material may include Group III and Group V material in a ratio that results in fixed dopants in a desired concentration. Deposition timing and materials may be adjusted so as to grow an active region in which fixed dopant is distributed throughout the region or, alternatively, in which the fixed dopant is more abundant in a particular subregion of the active region. Appropriate growth conditions, such as deposition speed and substrate temperature, may be chosen to achieve the chemical composition and local atomic structure desired. Fixed defects may also be created in the active region by exposing the deposited region to molecular bombardment of sufficient energy, such as argon beam bombardment.

Non-limiting examples of suitable materials for the active region include oxides, sulfides, selenides, nitrides, phosphides, arsenides, chlorides, and bromides of silicon, transition metals, rare earth metals, or alkaline earth metals. Further various alloys of like compounds may be used if they are mutually soluble. There are also mixed compounds in which two, three, or more different metal atoms are combined with some number of electronegative elements. Materials including the elements Ti, Zr, and Hf (e.g. titania, zirconia, and hafnia) are particularly attractive because they can be compatible with Si integrated circuit technology, as all of these have the same primary oxidation state (+4). As such, these elements would not create unintentional doping of the Si.

Further possible compounds include alloys of titania, zirconia, and hafnia, and compounds that combine Ti with other divalent elements (e.g. Sr, Mg, Ca, Cd, Zn). It is also possible to use alloys of these various compounds such as $Ca_aSr_bBa_cTi_xZr_yHf_zO_3$, where $a+b+c=1$ and $x+y+z=1$. It is to be further understood that the active region may include sublayers of different materials or compounds chosen from the above examples.

Figure 2C:
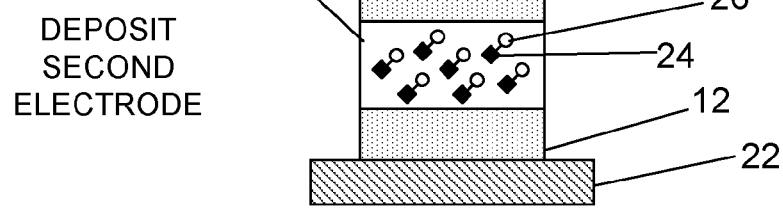
Figure 2D:
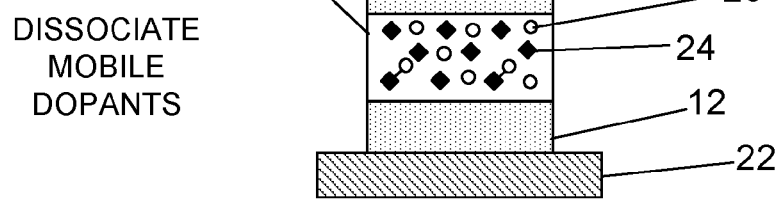

A further step in fabricating the device can include adding one or more mobile dopants 26. In one embodiment, referring again to FIG. 2B, mobile dopants may also be included in the active region material as it is deposited. In a more particular embodiment, the mobile dopants may be bound to or otherwise associated with fixed dopants. After completion of the device by depositing a second electrode 14 (FIG. 2C), the mobile dopants may be caused to dissociate and move through the active region (FIG. 2D). For example, a carrier gas including hydrogen may be used to transport material for deposition, so that hydrogen is incorporated in the active region. Hydrogen may later be dissociated from the lattice structure by applying a sufficient voltage to or by heating the device. The hydrogen may then serve as a mobile dopant species in the device.

In another embodiment as shown in FIG. 3A through FIG. 3F, mobile dopants may be added to the device after deposition of the active region. In one particular embodiment, as shown in FIGS. 3A and 3B, a first electrode 12 may be deposited on a substrate 22, and then an active region 16 including fixed dopants 24 deposited on the electrode. As a further step shown in FIG. 3C, mobile dopants 26 can be added by depositing a dopant layer 28 onto the active region. The dopant layer may be established via any suitable, technique, such as sputtering, electron beam evaporation, molecular beam epitaxy, CVD, MOCVD, or atomic layer deposition (ALD). The thickness may be varied as desirable, depending on the desired switching properties of the device. In one non-limiting example, the thickness of the dopant layer may range from about 5 nanometers to about 30 nanometers.

The dopant layer can comprise a material that is suitable for providing dopants that can be hosted by the active region material and move through the material under a suprathreshold actuating voltage. In another embodiment, the dopant layer can comprise an initiator material that reacts with the active region material to create mobile dopants. In some embodiments these mobile dopants can be vacancies. For example, oxygen vacancies can be created by initiator/active material reactions such as $TiO_{2-x}$ with $TiO_2$; $ZrO_{2-x}$ with $ZrO_2$, or $SrTiO_{3-x}$ with $SrTiO_3$. In another example, nitrogen vacancies can be created by reacting GaN with $GaN_{1-x}$. In other embodiments the mobile dopants may be ions, such as sulfide ions produced by a GaN:S initiator layer on an active region including GaN.

In some applications it may be desirable to have more control over the placement of mobile dopants in the device. As discussed above, dopants that move into the active material establish localized conductance channels, or switching centers, that collectively diminish the tunneling barrier across the material. The distribution of these switching centers across the active region can be at least partly due to the distribution of dopants or dopant initiators in the dopant layer. However, in applying the dopant layer, the eventual distribution of dopants in the layer may nut be entirely predictable. Accordingly, in some embodiments as depicted in FIGS. 3E and 3F, particular processes may be used to implant mobile dopants in a surface of the active region before deposition of the second electrode.

In a particular embodiment, dopant ions may be sourced from a plasma and delivered to the active region material by processes such as plasma immersion. In such an approach, the active region may be immersed in a dopant ion plasma and biased so as induce treatment of the surface with ions. As the ions impact the surface with relatively low energy, this approach may be desirable when a shallow region of dopants is called for.

In another particular embodiment, dopants may be introduced by ion implantation, where the active region material or the dopant layer is directly bombarded with accelerated mobile dopant ions so as to embed them in the material surface. In such an approach, the average depth of penetration may be controlled by adjusting the acceleration energy used in the implantation process. This approach may be particularly useful when a wide but deeper distribution of dopants across the active region is desired. When more discrete and localized doping is desired, additional control may be exerted over placement by masking the target region. For example the region may be masked so that only the desired locations are exposed to the implantation beam.

Additional control over the average depth of penetration and distribution of the implanted dopants can be achieved by masking the active region with a suitable polymer or dielectric material of suitable thickness such as photoresist or silicon dioxide. In another example, a mask can be aligned with the beam source so that only ions striking at or near an optimal incidence angle are allowed through. Masking may be performed by applying a photoresist or by other techniques known in the art. This approach also insures that more of the ions are implanted, and avoids sputtering and channeling effects. This technique may be used to create discrete dopant-containing substructures in the active region, so as to provide more control over where switching regions will develop. For example, implanted dopants may constitute channels of dopant extending down into the dopant region.

Dopants may be introduced to the device by other techniques that afford precise dopant placement. For example, mobile dopants may be prepared at an earlier stage in device fabrication. In one embodiment, a dopant film may be deposited before one or more device components (e.g. the active region or the electrode) are formed. Furthermore, mobile dopants may be added to the dopant film by any of the techniques discussed above. Once the dopant film is prepared, a device component may be deposited on top of it. This approach may be particularly helpful when employing highly mobile dopants that occur in a volatile form such as a gas (e.g. hydrogen), and it is desirable that dopants are only provided to a particular surface or interface without contacting other surfaces or device components. In one embodiment, a dopant film is formed on a substrate, then a dopant is added to the film, after which an electrode is deposited onto the film followed by an active region material. The dopant may be caused to move to the active region so as to be available for doping the active region material. In a more specific embodiment, all or part of the device may be treated so as to prevent the escape of mobile dopants. For example, when hydrogen is utilized as a mobile dopant, it may be desirable to seal the device against hydrogen escape. This may be accomplished by techniques and materials known in the art, such as passivation using silicon nitride or other suitable dielectrics.

Summarizing and reiterating to some extent, an electrically actuated device has been disclosed which exhibits multiple state variables. The device can include a combination of fixed and mobile dopants. While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An electrically actuated device, comprising:
   a first electrode;
   a second electrode;
   an active region disposed between the first electrode and the second electrode;
   a fixed dopant distributed within the active region; and
   at least one type of mobile dopant situated near an interface between the active region and the second electrode.

2. The electrically actuated device of claim 1, wherein at least one type of the mobile dopant is capable of reversibly passivating other types of mobile dopants.

3. The electrically actuated device of claim 1, wherein at least one of type of the mobile dopant is capable of reversibly passivating the fixed dopant.

4. The electrically actuated device of claim 1, wherein at least one type of the mobile dopant is in channels extending down into the active region.

5. The electrically actuated device of claim 1, wherein the at least one type of mobile dopant is hydrogen.

6. The electrically actuated device of claim 1, wherein at least one type of the mobile dopant is also present substantially throughout the active region.

7. A method for fabricating the electrically actuated device of claim 1, comprising:
   depositing the first electrode onto a substrate;
   depositing an active region material together with a fixed dopant material onto the first electrode to create the active region having fixed dopants distributed therein;
   placing mobile dopants in a portion of the active region;
   depositing the second electrode onto the active region so that the active region is disposed between the first electrode and the second electrode and the mobile dopants are situated near the interface between the active region and the second electrode.

8. The method of claim 7, wherein the mobile dopants are capable of reversibly passivating other mobile dopants.

9. The method of claim 7, wherein the mobile dopants are capable of reversibly passivating the fixed dopants.

10. The method of claim 7, wherein the mobile dopants are included in the fixed dopant material.

11. The method of claim 7, wherein the mobile dopants include hydrogen.

12. The method of claim 7, wherein the placing step is accomplished by ion implantation.

13. The method of claim 7, wherein the placing step is accomplished by plasma immersion.

14. The method of claim 7, wherein the placing step is accomplished by depositing a film including a mobile dopant adjacent to the interface.

15. The method of claim 7, wherein the substrate includes a mobile dopant-containing film deposited onto the substrate.

* * * * *